(12) United States Patent
Chang et al.

(10) Patent No.: US 8,496,210 B2
(45) Date of Patent: Jul. 30, 2013

(54) ELECTRONIC APPARATUS CARRYING DEVICE

(75) Inventors: Chun-Yuan Chang, New Taipei (TW); Tzu-Hsiu Hung, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 8 days.

(21) Appl. No.: 13/169,038

(22) Filed: Jun. 27, 2011

(65) Prior Publication Data

US 2012/0236474 A1    Sep. 20, 2012

(30) Foreign Application Priority Data

Mar. 14, 2011   (CN) .......................... 2011 2 0065718

(51) Int. Cl.
*G06F 1/16*    (2006.01)

(52) U.S. Cl.
USPC ..................... 248/27.3; 248/221.11; 248/918; 361/679.02; 312/223.1

(58) Field of Classification Search
USPC .................. 248/220.21, 221.11, 222.11, 918, 248/27.3; 361/679.02, 679.31, 679.32, 679.33, 361/679.37, 679.4, 679.41; 312/223.1, 223.2
See application file for complete search history.

(56) References Cited

U.S. PATENT DOCUMENTS

| | | | | |
|---|---|---|---|---|
| 5,020,151 A | * | 5/1991 | Sampei et al. | ................ 455/345 |
| 5,791,753 A | * | 8/1998 | Paquin | ....................... 312/332.1 |
| 6,231,144 B1 | * | 5/2001 | Chen et al. | ................. 312/332.1 |
| 6,373,695 B1 | * | 4/2002 | Cheng | ...................... 361/679.39 |
| 2010/0053888 A1 | * | 3/2010 | Nagamura et al. | ....... 361/679.59 |

* cited by examiner

*Primary Examiner* — Steven Marsh
(74) *Attorney, Agent, or Firm* — Altis Law Group, Inc.

(57) ABSTRACT

An electronic apparatus carrying device for carrying an electronic apparatus is disclosed. The electronic apparatus carrying includes a device shell and a pulling tray slidably connected to the shell. The shell defines an insert opening therein, the pulling tray is passable through the inserting opening. The pulling tray includes a tray portion and a handle portion connected to the tray portion. The tray portion supports and carries the electronic apparatus. The handle portion includes a pull bar and two cranks. The cranks includes first ends pivotally coupled to opposite ends of the tray portion, and opposing second ends slidably and pivotally coupled to opposite ends of the pulling bar. Each of the first end of the cranks having an engaging portion, the cranks are rotatable about a rotating axis at the first ends between a first position and a second position.

9 Claims, 5 Drawing Sheets

ELECTRONIC APPARATUS CARRYING DEVICE

BACKGROUND

1. Technical Field

The present disclosure relates to electronic apparatus carrying devices, and particularly, relates to an electronic apparatus carrying device used in an computer.

2. Description of Related Art

Electronic apparatus carrying devices, which are used for carrying electronic apparatuses are typically used on computers. The electronic apparatus carrying device moves to a direction for electrically connecting the electronic apparatus to another electronic apparatus of the computer, and the electronic apparatus carrying devices moves to an opposite direction for detaching the electronic apparatuses from each other. The electronic apparatuses should be tightly connected to each other to ensure the stability of the electrical connection.

However, if the electronic apparatuses are tightly connected to each other, it is difficult to move the electronic carrying device when the electronic apparatuses need to be detached from each other. In addition, if a value of a force applied on the electronic carrying device is too large, the electronic apparatuses may be damaged when being suddenly detached from each other.

What is needed therefore is an electronic apparatus carrying device addressing the limitations described.

BRIEF DESCRIPTION OF THE DRAWINGS

The components of the drawings are not necessarily drawn to scale, the emphasis instead being placed upon clearly illustrating the principles of the embodiments of the electronic apparatus carrying device. Moreover, in the drawings, like reference numerals designate corresponding parts throughout several views.

DETAILED DESCRIPTION

Figure 1:
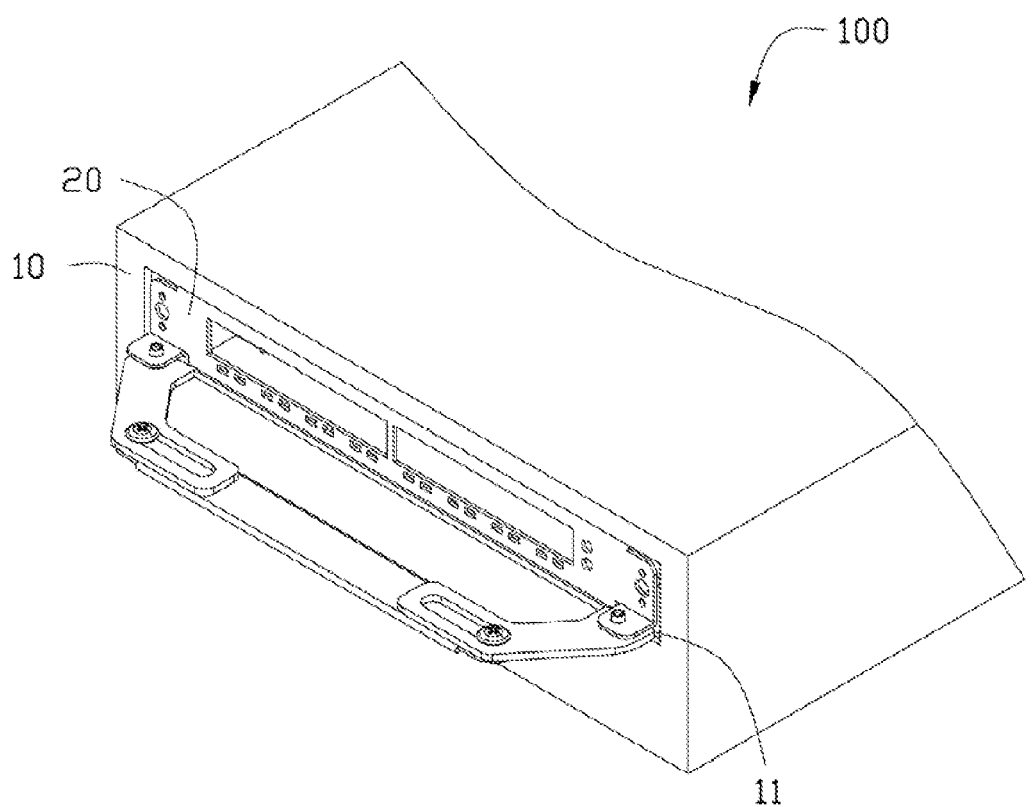
FIG. 1 is a isometric view of an electronic apparatus carrying device, according to an exemplary embodiment of the present disclosure, the electronic apparatus carrying device includes a shell and a pulling tray.
Figure 2:
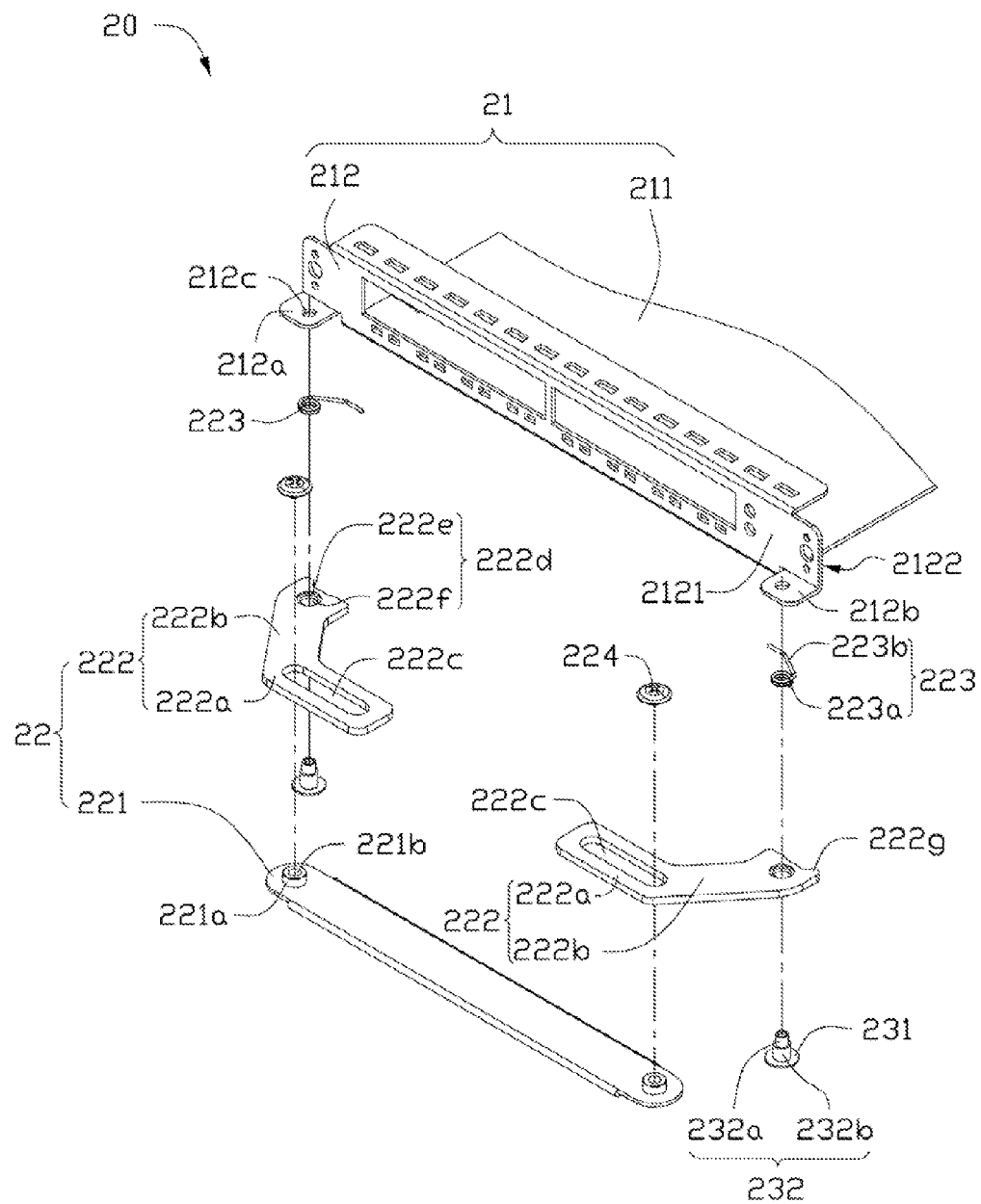
FIG. 2 is an exploded view of the pulling tray of the electronic apparatus carrying device of FIG. 1.

Referring to the FIGS. 1-2, an electronic apparatus carrying device 100, according to an exemplary embodiment, is shown. The electronic apparatus carrying device 100 includes a shell 10 and a pulling tray 20 slidably connected to the shell 10.

The shell 10 defines an insert opening 11 for the pull tray 20 to be inserted therein. The shell 10 can be a computer shell, or a hard drive shell.

The pull tray 20 includes a tray portion 21 and a handle portion 22 connected to the tray portion 21. The tray portion 21 is configured for supporting and carrying an electronic apparatus (not shown). The tray portion 21 includes a carrying board 211 and an front board 212 connected to an end of the carrying board 211. In this embodiment, the front board 212 is substantially perpendicular to the carrying board 211. The front board 212 includes a front surface 2121 and an opposite back surface 2122. The back surface 2122 faces the carrying board 211. The front board 212 includes a first connecting piece 212a and a second connecting piece 212b. The first connecting piece 212a and the second connecting piece 212b are formed on opposite ends of the front board 212 and substantially perpendicular to the front surface 2121. Each of the first connecting piece 212a and the second connecting piece 212b defines a through hole 212c.

The handle portion 22 includes a pull bar 221 and two cranks 222. The pull bar 221 includes two posts 221a, the posts 221a are formed on two opposite ends of the pull bar 221. Each post 221a defines a threaded hole 221b in a distal end surface. Each crank 222 includes a first connecting portion 222a and a second connecting portion 222b connected to the first connecting portion 222a at an angle, in this embodiment, the angle between the first connecting portion 222a and the second connecting portion 222b is more than 90 degrees. The first connecting portion 222a defines a slot 222c, the slot 222c is elongated along the lengthwise direction of the first connecting portion 222a. The second connecting portion 222b defines a connecting hole 222d on an end away from the first connecting portion 222a. In this embodiment, the connecting hole 222d is a stepped hole, which includes a first section 222e and a second section 222f. The diameter of the first section 222e is greater than the second section 222f. Each crank 222 further includes a protruding portion 222g formed on a distal end of the second connecting portion 222b. The protruding portion 222g of one crank 222 is formed on a side away from the other crank 222.

The handle portion 22 further includes an spring member 223 and two bolts 224. The spring member 223 is configured for urging the cranks to move from a first position to a second position. In this embodiment, the spring member 223 is an torsion spring, which includes a spiral portion 223a and an torsion arm 223b extending from an end of the spiral portion 223a. The two bolts 224 are corresponded to a posts 221a of the pull bar 221.

The pull tray 20 further includes two pins 23 for rotatably connecting the handle portion 22 to the tray portion 21. Each pin 23 includes a head portion 231 and a shank portion 232 connected to the head portion 231. The shank portion 232 includes a base part 232a and a tip part 232b extending from the base part 232a, the base part 232a is connected to the head portion 231. The diameter of the base part 232a is greater then that of the tip part 323b.

Figure 3:
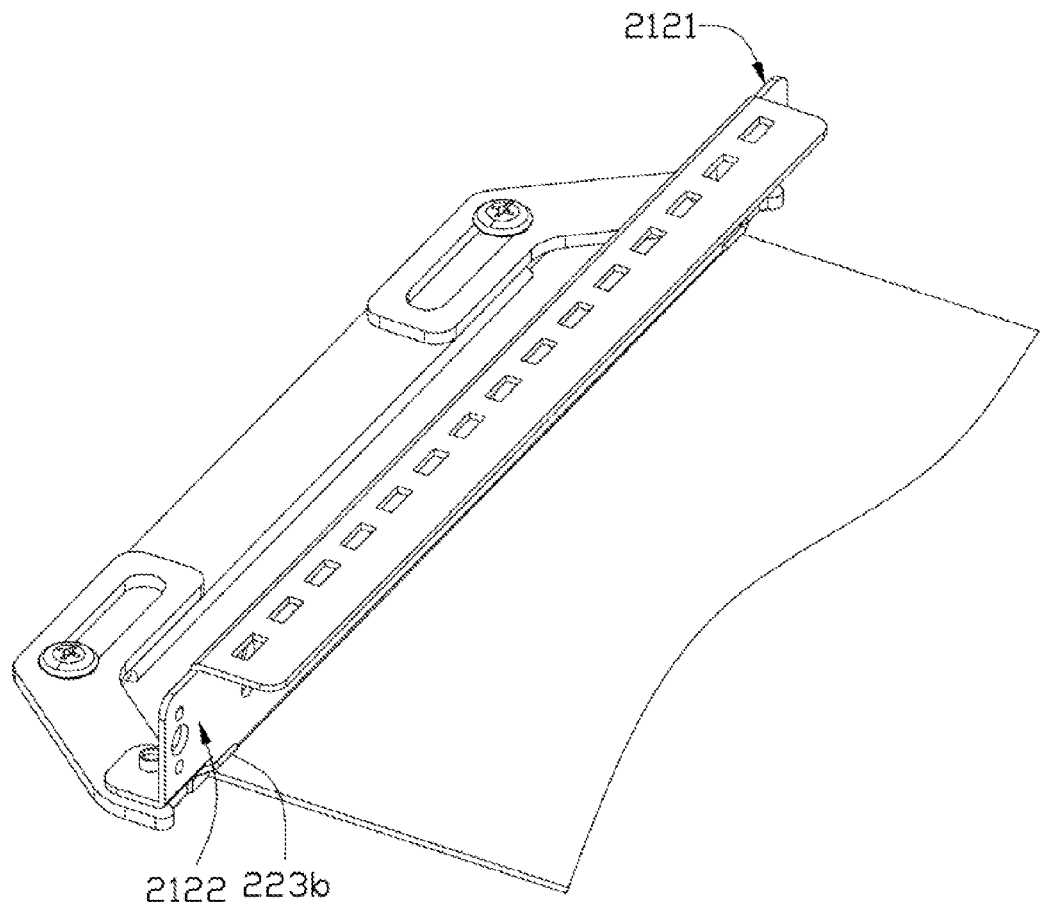
FIG. 3 is an assembly view of the pulling tray of FIG. 2.

Referring to FIG. 3, in assembly, the posts 221a of the pull bar 221 are inserted into the corresponding slots 222c of the cranks 222, the bolts 224 are connected into the corresponding threaded holes 221b of the posts 221a, thus the posts 221a are slidably and pivotally coupled in the slots 222c. The spiral portion 223a of each spring member 223 is fixed in the first section 222e of the corresponding connecting hole 222d. The connecting holes 222d of the cranks 222 are correspondingly aligned with the through holes 212c of the first connecting piece 212a and the second connecting piece 212b. The cranks 222 are pivotally coupled to the first connecting piece 212a and the second connecting piece 212b via the pins 23. In detail, the shank portion 232 of each pin 23 is inserted into the corresponding connecting hole 222d and through hole 212c in turn, the base part 232a is in clearance fit with the connecting hole 222d, and the tip part 232b is in interference fit with the through hole 212c. The torsion arm 223b of each spring member resists on the back surface 2122 of the front board 212.

Figure 4:
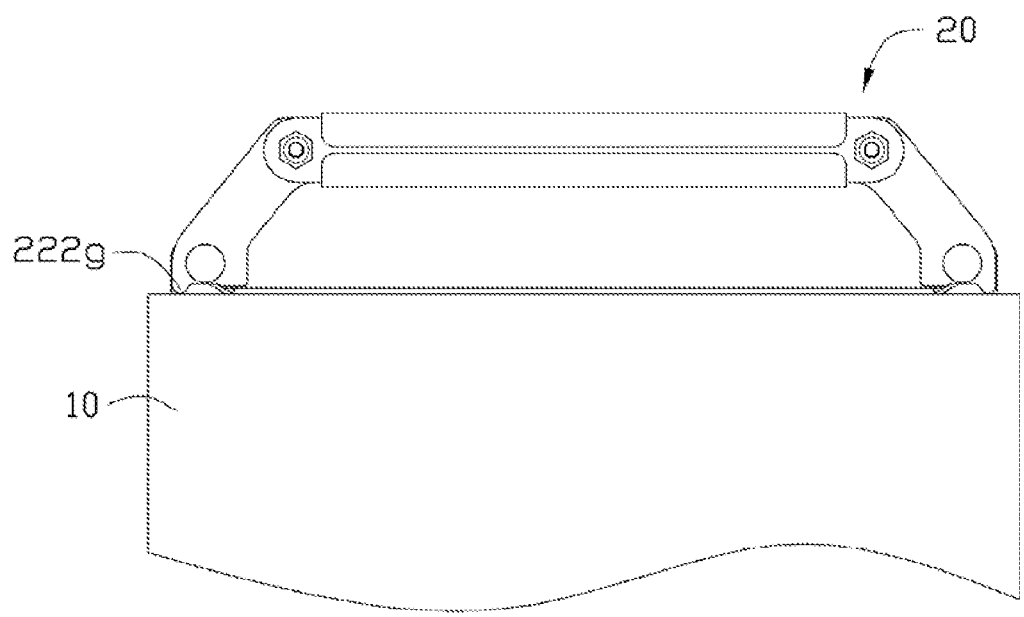
FIG. 4 is a bottom plan view of the electronic apparatus carrying device of FIG. 1.
Figure 5:
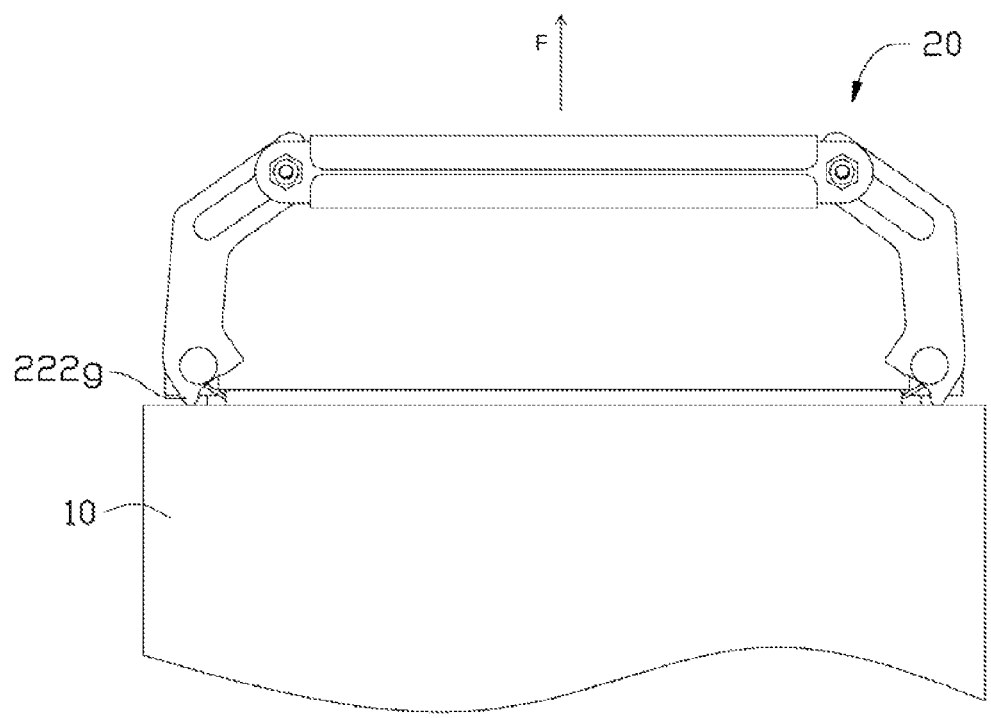
FIG. 5 is another using state of the electronic apparatus carrying device of FIG. 4.

Also referring to FIGS. 4-5, the assembled pulling tray 20 is slidably connected to the shell 10 and passable through the insert opening. The carrying board may carry a first electronic apparatus (not shown) thereon, and the shell 10 may contain a second electronic apparatus (not shown), the first electronic apparatus and the second electronic apparatus need to be connected to each other to perform a predetermined function. In use, the shell 10 is fixed. The tray portion 21 is inserted into the insert opening 11 to connecting the first electronic apparatus and the second connecting apparatus to each other. And further, the tray portion 21 is tightly engaged into the insert opening 11 to ensure the stability of the connection between the first electronic apparatus and the second electronic apparatus. When the tray portion 21 is engaged into the insert opening 11, the protruding portion 222g of the cranks 222 are resisted on the first surface 2121 of the front board 212. When the first electronic apparatus needs to be detached from the second electronic apparatus, a force F is applied on the pull bar 221, the direction of the force F is away from the shell 10, in this embodiment, the direction of the force F is substantially perpendicular to the pull bar 221. The pull bar 221 moves away from the shell 10 under the force F, the posts 221a drives the cranks 222 to rotate around central axis of the connection hole 222d, and the posts slide along the corresponding slots during the rotating of the cranks 222. The protruding portion 222g of each crank pushes the shell 10 away from the tray portion 21, because the shell 10 is fixed, the tray portion 21 is pulled out from the insert opening 11 of the shell 10. During the rotation of the cranks 222, the spring members 223 are elastically deformed, when the force F disappears, the cranks 222 and the pull bar 221 move to the original positions under the elasticity of the spring members 223.

Because the connection hole 222d is defined in an end of the crank 222 near the protruding portion, the torque of the force applied on the crank 222 by the pull bar 221 is more than that of the reaction force of the shell 10 applied on the protruding portion 222g, therefore, even a small force is applied on the crank 222 by the pull bar 221, a large force can be applied on the shell 10 by the protruding portion 222g. Consequently, it is easy to pull the tray portion 21 out from the insert opening 11 of the shell 10, and the damage of the first electronic apparatus and the second electronic apparatus can be avoided.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. An electronic apparatus carrying device for carrying an electronic apparatus, comprising:
    a shell defining an insert opening therein; and
    a pulling tray slidably connected to the shell, the pulling tray passable through the insert opening, the pulling tray comprising:
        a tray portion configured for supporting and carrying the electronic apparatus; and
        a handle portion connected to the tray portion, the handle portion comprising:
            a pulling bar; and
            two cranks including first ends pivotally coupled to opposite ends of the tray portion, and opposing second ends slidably and pivotally coupled to opposite ends of the pulling bar, each of the first ends of the cranks having an engaging portion protruding from the first end to the shell, the engaging portion of one of the cranks being located on a side away from the other of the cranks, the cranks being rotatable about a rotating axis at the first ends between a first position where the pulling bar is nearest to the tray portion and the engaging portions are spaced apart from the shell, and a second position where the pulling bar is farthest from the tray portion and the engaging portions push against the shell.

2. The electronic apparatus carrying device of claim 1, wherein the tray portion comprises a carrying board and a front board substantially perpendicular to the carrying board, the front board faces the handle portion.

3. The electronic apparatus carrying device of claim 2, wherein the front board comprises two connecting pieces formed on opposite ends of the front board, the second ends of the cranks are rotatably connected to the connecting pieces, respectively.

4. The electronic apparatus carrying device of claim 3, wherein the pulling tray comprises two pins, each of the connecting pieces defines a through hole, each of the second ends of the cranks defines a connecting hole, and each of the two pins extends through the connecting hole of a corresponding one of the second ends and the through hole of a corresponding one of the connecting pieces.

5. The electronic apparatus carrying device of claim 4, wherein each pin comprises a head portion and a shank portion, the shank portion comprises a base part and a tip part extending from the base part, the base part is connected to the head portion, the base part is in clearance fit with the connecting hole, and the tip part is in interference fit with the through hole.

6. The electronic apparatus carrying device of claim 4, wherein the handle portion comprises two spring members configured for urging the cranks to move from the second position to the first position.

7. The electronic apparatus carrying device of claim 6, wherein each spring member comprises a spiral portion and a torsion arm extending from the spiral portion, the spiral portion of each spring member is fixed in the connecting hole of a corresponding one of the second ends, and the torsion arm of each spring member pushes against the front board.

8. The electronic apparatus carrying device of claim 1, wherein each of the cranks defines a slot at the second end, and the pulling bar comprises two posts formed on opposite ends thereof, with each of the posts slidably engaged in the slot of a corresponding one of the cranks.

9. The electronic apparatus carrying device of claim 8, wherein each slot includes a first end adjacent to an extremity of the second end, and an opposing second end, each post is slidable in the corresponding slot between a first sliding position where the post is in the first end of the slot and the crank is in the second position, and a second sliding position where the post is in the second end of the slot and the crank is in the first position.

* * * * *